(12) United States Patent
Das et al.

(10) Patent No.: US 9,420,689 B2
(45) Date of Patent: *Aug. 16, 2016

(54) METHOD OF MAKING A CIRCUITIZED SUBSTRATE

(75) Inventors: Rabindra N. Das, Vestal, NY (US); Michael J. Rowlands, Conklin, NY (US)

(73) Assignee: i3 Electronics, Inc., Endicott, NY (US)

( * ) Notice: Subject to any disclaimer, the term of this patent is extended or adjusted under 35 U.S.C. 154(b) by 1184 days.

This patent is subject to a terminal disclaimer.

(21) Appl. No.: 12/589,239

(22) Filed: Oct. 20, 2009

(65) Prior Publication Data

US 2011/0039212 A1     Feb. 17, 2011

Related U.S. Application Data

(60) Division of application No. 11/806,685, filed on Jun. 4, 2007, now Pat. No. 7,687,724, which is a continuation-in-part of application No. 11/031,074, filed on Jan. 10, 2005, now Pat. No. 7,025,607.

(51) Int. Cl.
    *H01K 3/10*     (2006.01)
    *H05K 1/09*     (2006.01)

(52) U.S. Cl.
    CPC ........................... *H05K 1/095* (2013.01)

(58) Field of Classification Search
    USPC ............ 29/613, 614, 832, 846, 852; 438/330, 438/396
    See application file for complete search history.

(56) References Cited

U.S. PATENT DOCUMENTS

| | | |
|---|---|---|
| 5,016,085 A | 5/1991 | Hubbard et al. |
| 5,079,069 A | 1/1992 | Howard et al. |
| 5,099,309 A | 3/1992 | Kryzaniwsky |
| 5,162,977 A | 11/1992 | Paurus et al. |
| 5,280,192 A | 1/1994 | Kryzaniwsky |
| 5,426,263 A | 6/1995 | Potter et al. |
| 5,831,833 A | 11/1998 | Shirakawa et al. |
| 6,021,050 A | 2/2000 | Ehman et al. |
| 6,068,782 A | 5/2000 | Brandt et al. |
| 6,084,306 A | 7/2000 | Yew et al. |
| 6,150,456 A | 11/2000 | Lee et al. |
| 6,207,595 B1 | 3/2001 | Appelt et al. |
| 6,242,282 B1 | 6/2001 | Fillion et al. |
| 6,370,012 B1 | 4/2002 | Adae-Amoakoh et al. |
| 6,395,996 B1 | 5/2002 | Tsai et al. |
| 6,396,387 B1 | 5/2002 | Hunt et al. |
| 6,446,317 B1 | 9/2002 | Figueroa et al. |
| 6,500,350 B1 | 12/2002 | Hunt et al. |
| 6,524,352 B2 | 2/2003 | Adae-Amoakoh et al. |
| 6,544,651 B2 | 4/2003 | Wong et al. |
| 6,616,794 B2 | 9/2003 | Hartman et al. |
| 6,704,207 B2 | 3/2004 | Kopf |
| 6,740,701 B2 | 5/2004 | Chacko |
| 6,746,508 B1 | 6/2004 | Deevi et al. |
| 6,751,082 B2 * | 6/2004 | Devoe et al. ............... 361/321.2 |
| 6,753,218 B2 * | 6/2004 | Devoe et al. .................. 438/240 |

(Continued)

*Primary Examiner* — Carl Arbes

(57) ABSTRACT

A circuitized substrate which utilizes at least one internal (embedded) resistor as part thereof, the resistor comprised of a material including resin and a quantity of powders of nano-particle and/or micro-particle sizes. The resistor serves to decrease the capacitance in the formed circuit while only slightly increasing the high frequency resistance, thereby improving circuit performance through the substantial elimination of some discontinuities known to exist in structures like these. An electrical assembly (substrate and at least one electrical component) is also provided.

8 Claims, 3 Drawing Sheets

(56) References Cited

U.S. PATENT DOCUMENTS

| | | |
|---|---|---|
| 6,967,138 B2 | 11/2005 | Ding |
| 7,025,607 B1 | 4/2006 | Das et al. |
| 7,659,176 B2 * | 2/2010 | Coolbaugh et al. ........... 438/385 |
| 8,240,027 B2 * | 8/2012 | Egitto et al. .................... 29/620 |
| 2003/0146418 A1 | 8/2003 | Chacko |
| 2003/0161091 A1 * | 8/2003 | Devoe et al. ............... 361/321.2 |
| 2004/0231758 A1 | 11/2004 | Hampden-Smith et al. |
| 2005/0000728 A1 | 1/2005 | Tanaka |
| 2005/0051360 A1 | 3/2005 | Su et al. |
| 2006/0145296 A1 * | 7/2006 | Coolbaugh et al. ........... 257/536 |
| 2006/0151202 A1 * | 7/2006 | Das et al. ...................... 174/256 |
| 2007/0254449 A1 * | 11/2007 | Coolbaugh et al. ........... 438/382 |
| 2008/0087459 A1 * | 4/2008 | Das et al. ...................... 174/260 |
| 2008/0151515 A1 * | 6/2008 | Das et al. ...................... 361/761 |

* cited by examiner

US 9,420,689 B2

METHOD OF MAKING A CIRCUITIZED SUBSTRATE

CROSS REFERENCE TO APPLICATIONS

The present application is a divisional application of Ser. No. 11/806,685, filed Jun. 4, 2007, now U.S. Pat. No. 7,687,724 which is a continuation-in-part application of Ser. No. 11/031,074 (now U.S. Pat. No. 7,025,607), having a filing date of Jan. 10, 2005.

TECHNICAL FIELD

The present invention relates to providing resistors within circuitized substrates such as printed circuit boards, chip carriers and the like, and more specifically to a method for doing so and to products including such internal resistors as part thereof. Even more particularly, the invention relates to such methodologies and products wherein the internal resistors are formed using powder materials having nano-particles or micro-particles or combinations of both as part thereof.

In Ser. No. 11/730,761, filed Apr. 4, 2007, and entitled "Non-Flaking Capacitor Material, Capacitive Substrate Having An Internal Capacitor Therein Including Said Non-Flaking Capacitor Material And Method Of Making A Capacitor Member For Use In A Capacitive Substrate," there is defined a capacitor material including a thermosetting resin (e.g., epoxy resin), a high molecular mass flexibilizer (e.g., phenoxy resin), and a quantity of nano-particles of a ferroelectric ceramic material (e.g., barium titanate), the capacitor material not including continuous or semi-continuous fibers (e.g., fiberglass) as part thereof. The material is adapted for being positioned in layer form on a first conductor member and heated to a predetermined temperature whereupon the material will not possess any substantial flaking characteristics. A second conductor member may then be positioned on the material to form a capacitor member, which then may be incorporated within a substrate to form a capacitive substrate. Electrical components may be positioned on the substrate and capacitively coupled to the internal capacitor.

In Ser. No. 11/352,279, entitled "Method Of Making A Capacitive Substrate For Use As Part Of A Larger Circuitized Substrate, Method of Making Said Circuitized Substrate-and Method of Making An Information Handling System Including Said Circuitized Substrate" and filed Feb. 13, 2006, there is defined a method of forming a capacitive substrate in which at least one capacitive dielectric layer of material is screen or ink jet printed onto a conductor and the substrate is thereafter processed further, including the addition of thru-holes to couple selected elements within the substrate to form at least two capacitors as internal elements of the substrate. The capacitive substrate may be incorporated within a larger circuitized substrate, e.g., to form an electrical assembly. A method of making an information handling system including such substrates is also provided. In one example, epoxy novolac resin and a phenoxy resin are mixed together with barium titanate ($BaTiO_3$) powder and propylene glycol monomethyl ether acetate and methylethyl ketone and ball milled for three days. A 2.5 micron thin film of this mixed composite was then deposited on a copper substrate and dried at approximately 140 degrees C. for three minutes in an oven to remove residual organic solvents. This was followed by curing in an oven at 190 degrees C. for two hours. A second electrical conductor was then formed using a sputtering operation atop the cured film using a mask normally used for such sputtering operations.

In Ser. No. 11/352,276, entitled "Method Of Making A Capacitive Substrate Using Photoimagable Dielectric For Use As Part Of A Larger Circuitized Substrate, Method of Making Said Circuitized Substrate and Method of Making An Information Handling System Including Said Circuitized Substrate" and also filed Feb. 13, 2006, there is defined a method of forming a capacitive substrate in which at least one capacitive dielectric layer of material is screen or ink jet printed onto a conductor and the substrate is thereafter processed further, including the addition of thru-holes to couple selected elements within the substrate to form at least two capacitors as internal elements of the substrate. Photoimagable material is used to facilitate positioning of the capacitive dielectric being printed. The capacitive substrate may be incorporated within a larger circuitized substrate, e.g., to form an electrical assembly. A method of making an information handling system including such substrates is also provided.

In Ser. No. 11/244,180, entitled "Circuitized Substrate With Solder-Coated Microparticle Paste Connections, Multilayered Substrate Assembly, Electrical Assembly And Information Handling System Utilizing Same And Method Of Making Said Substrate," filed Oct. 6, 2005, there is defined a circuitized substrate which includes a conductive paste for providing electrical connections The paste, in one embodiment, includes a binder component and at least one metallic component including micro-particles. In another embodiment, the paste includes the binder and a plurality of nano-wires. Selected ones of the micro-particles or nano-wires include a layer of solder thereon. A method of making such a substrate is also provided, as are an electrical assembly and information handling system adapter for having such a substrate as part thereof.

In Ser. No. 11/172,794, entitled "Method Of Making An Internal Capacitive Substrate For Use In a Circuitized Substrate And Method Of Making Said Circuitized Substrate" and filed Jul. 5, 2005, there is defined a method of forming a capacitive substrate in which first and second conductors are formed opposite a dielectric, with one of these electrically coupled to a thru-hole connection. Each functions as an electrode for the resulting capacitor. The substrate is then adapted for being incorporated within a larger structure to form a circuitized substrate such as a printed circuit board or a chip carrier. Additional capacitors are also possible. In one of the examples (Example 5) cited in this pending application, epoxy novolac resin and a phenoxy resin are mixed together with barium titanate ($BaTiO_3$) powder and propylene glycol monomethyl ether acetate and methyl ethyl ketone and ball milled for three days. A 2.5 micron thin film of this mixed composite was deposited on a copper substrate and dried at approximately 140 degrees C. for three minutes in an oven to remove residual organic solvents. This was followed by curing in an oven at 190 degrees C. for two hours. A second electrical conductor was then formed using a sputtering operation atop the cured film using a mask normally used for such sputtering operations.

In Ser. No. 11/172,786, entitled "Resistor Material With Metal Component For Use In Circuitized Substrates, Circuitized Substrate Utilizing Same, Method of Making Said Circuitized Substrate And Information Handling System Utilizing Said Circuitized Substrate," fled Jul. 5, 2005, there is define a material for use as part of an internal resistor within a circuitized substrate which includes a polymer resin and a quantity of nano-powders including a mixture of at least one metal component and at least one ceramic component. The ceramic component may be a ferroelectric ceramic and/or a high surface area ceramic and/or a transparent oxide and/or a dope manganite. Alternatively, the material will include the polymer resin and nano-powders, with the nano-powders comprising at least one metal coated ceramic and/or at least one oxide coated metal component. A circuitized substrate adapted for using such a material and resistor therein and a method of making such a substrate are also provided. An electrical assembly (substrate and at least one electrical component) and an information handling system (e.g., personal computer) are also provided.

In Ser. No. 11/031,085, entitled "Capacitor Material For Use In Circuitized Substrates, Circuitized Substrate Utilizing Same, Method of Making Said Circuitized Substrate, And Information Handling System Utilizing Said Circuitized Substrate", filed Jan. 10, 2005, there is defined a material for use as part of an internal capacitor within a circuitized substrate wherein the material includes a polymer resin and a quantity of nano-powders of ceramic material having a particle size substantially in the range of between about 0.01 microns and about 0.90 microns and a surface area for selected ones of said particles within the range of from about 2.0 to about 20 square meters per gram. A circuitized substrate adapted for using such a material and capacitor therein and a method of making such a substrate are also provided. An electrical assembly (substrate and at least one electrical component) and an information handling system (e.g., personal computer) are also provided.

In Ser. No. 11/031,074, entitled Capacitor Material With Metal Component For Use In Circuitized Substrates, Circuitized Substrate Utilizing Same, Method Of Making Said Circuitized Substrate, and Information Handling System Utilizing Said Circuitized Substrate", also filed Jan. 10, 2005, there is defined a material for use as part of an internal capacitor within a circuitized substrate which includes a polymer resin and a quantity of nano-powders including a mixture of at least one metal component and at least one ferroelectric ceramic component, the ferroelectric ceramic component nano-particles having a particle size substantially in the range of between about 0.01 microns and about 0.9 microns and a surface area within the range of from about 2.0 to about 20 square meters per gram. A circuitized substrate adapted for using such a material and capacitor therein and a method of making such a substrate are also provided. An electrical assembly (substrate and at least one electrical component) and an information handling system (e.g., personal computer) are also provided. A divisional application of Ser. No. 11/031, 074, Ser. No. 11/324,273, was filed Jan. 4, 2006. Ser. No. 11/031,074 is now U.S. Pat. No. 7,025,607.

In Ser. No. 10/900,386, entitled "Electrical Assembly With Internal Memory, Circuitized Substrate Having Electrical Components Positioned Thereon, Method Of Making Same, And Information Handling System Utilizing Same" and filed Jul. 28, 2004, there is defined an electrical assembly which includes a circuitized substrate comprised of an organic dielectric material having a first electrically conductive pattern thereon. At least part of the dielectric layer and pattern form the first, base portion of an organic memory device, the remaining portion being a second, polymer layer formed over the part of the pattern and a second conductive circuit formed on the polymer layer. A second dielectric layer if formed over the second conductive circuit and first circuit pattern to enclose the organic memory device. The device is electrically coupled to a first electrical component through the second dielectric layer and this first electrical component is electrically coupled to a second electrical component. A method of making the electrical assembly is also provided, as is an information handling system adapted for using one or more such electrical assemblies as part thereof. Ser. No. 10/900, 386 is now U.S. Pat. No. 7,045,897.

In Ser. No. 10/900,385, entitled "Circuitized Substrate With Internal Organic Memory Device, Method Of Making Same, Electrical Assembly Utilizing Same, and-Information Handling System Utilizing Same" and filed Jul. 28, 2004, there is defined a circuitized substrate comprised of at least one layer of dielectric material having an electrically conductive pattern thereon. At least part of the pattern is used as the first layer of an organic memory device which further includes at least a second dielectric layer over the pattern and a second pattern aligned with respect to the lower part for achieving several points of contact to thus form the device. The substrate is preferably combined with other dielectric-circuit layered assemblies to form a multilayered substrate on which can be positioned discrete electronic components (e.g., a logic chip) coupled to the internal memory device to work in combination therewith. An electrical assembly capable of using the substrate is also provided, as is an information handling system adapted for using one or more such electrical assemblies as part thereof.

All of the above applications are assigned to the same Assignee as the present invention.

BACKGROUND OF THE INVENTION

Printed circuit boards (hereinafter also referred to as PCBs), chip carriers, and the like (these products referred to generally herein as circuitized substrates) typically are constructed in laminate form in which several layers of dielectric material and conductive material (laminates) are bonded together using relatively high temperature and pressure lamination processes. The conductive layers, typically of thin copper or copper alloy, are usually used in the formed substrate for providing electrical connections to and among various devices located on the surface of the substrate, examples of such devices being integrated circuits (semiconductor chips) and discrete passive devices, such as capacitors, resistors, inductors, and the like. The discrete passive devices occupy a relatively high percentage of the surface area of the completed substrate, which is undesirable from a future design aspect because of the increased need and demand for miniaturization in today's substrates and products containing same art. In order to increase the available substrate surface area (also often referred to as "real estate"), there have been a variety of efforts to include multiple functions (e.g. resistors, capacitors and the like) on a single component for mounting on a board. When passive devices are in such a configuration, these are often referred to collectively and individually as integral passive devices or the like, meaning that the functions are integrated into the singular component. Because of such external positioning, these components still utilize, albeit less than if in singular form, board "real estate."

In response to the above limitations, there have been efforts expended to embed discrete passive components within the internal portions of the substrate, such components then referred to as embedded passive components. A capacitor or resistor designed for disposition within (e.g., between selected layers) a substrate may thus be referred to as an embedded integral passive component, or, more simply, an embedded resistor or capacitor. Such a capacitor thus provides internal capacitance while a resistor provides internal resistance. The result of this internal positioning is that it is unnecessary to also position such devices externally on the PCB's outer surface(s), thus saving valuable PCB surface area.

Some of the documents listed below, U.S. Pat. No. 6,021, 050 in particular, describe the internal use of resistors as passive elements for a PCB. As stated in Ser. No. 11/031,074 (now U.S. Pat. No. 7,025,607), there have also been past attempts to provide internal capacitance and other internal conductive structures, components or devices (one good example being internal semiconductor chips) within circuitized substrates (PCBs), some of these including the use of nano-powders. The following are some examples of various substrate structures, including those with embedded components as described above, including those using nano-powders and those using alternative measures. The citation of these documents is not an admission that any are prior art to the present invention.

In U.S. Patent Application Publication 2005/0051360 A1, entitled "Polymer Thick-Film Resistive Paste, A Polymer Thick-Film Resistor And A Method And An Apparatus For The Manufacture Thereof," there are described formulations, apparatus and a method of applying high thixotropic index polymer thick-film resistive pastes for making polymer thick-film resistors with improved tolerances by providing a squeegee with a blade tilted at an angle of 10 to 85 to the surface of the printed circuit board. The tilted blade causes a fluid rotational motion within the bead of the polymer thick-film resistive paste as the squeegee blade moves relative to the printed circuit board. This rotational motion increases the shear strain rate experienced by the paste within the bead and results in a more effective filling of the resistor-shaped cavity without including air bubbles, experiencing elastic recovery of the paste and, without surface fractures of the paste.

In U.S. Patent Application Publication 2005/0000728 A1, entitled "Wiring Board Provided With A Resistor And Process For Manufacturing The Same," there is described a wiring board provided with a resistor, The board comprises an insulating substrate having a surface, wiring patterns formed on the surface, the wiring patterns including first and second electrodes spaced from each other by a certain distance, a first resistor (horizontal type resistor) formed on the surface, the first resistor having respective ends connected with the first and second electrodes, respectively, the wiring patterns further including a third electrode, occupying a first plane area on the surface, a second resistor (vertical type resistor) formed on the third electrode, a fourth electrode formed on the second resistor, and the second resistor, the fourth electrode being located in a second plane area within the first plane area.

In U.S. Patent Application Publication 2004/0231758 A1, entitled "Silver-Coated Particles, Method And Apparatus Of Manufacture, Silver-Containing Devices Made Therefrom," there is described the use of silver-containing powders and a method and apparatus for manufacturing the silver-containing particles of high quality, of a small size and narrow size distribution. An aerosol is generated from liquid feed and sent to a furnace, where liquid in droplets in the aerosol is vaporized to permit formation of the desired particles, which are then collected in a particle collector. The aerosol generation involves preparation of a high quality aerosol, with a narrow droplet size distribution, with close control over droplet size and with a high droplet loading suitable for commercial applications.

In U.S. Patent Application Publication 2003/0146418 A1, entitled "Resistive Film," there is described a resistive film for use in a potentiometer. The film is in contact with a movable wiper. The film includes a cured polymer resin and a cured thermosetting resin. Conductive particles of carbon black and graphite are dispersed in the film. The conductive particles cause the resins to be electrically resistive. Carbon nano-particles are also dispersed in the film. The nano-particles increase the wear resistance of the resistive film and reduce electrical noise as the wiper moves across the film.

In U.S. Pat. No. 6,967,138, entitled "Process For Manufacturing A Substrate With Embedded Capacitor," there is described a process for manufacturing a substrate with an embedded capacitor in which a first metal wiring layer including a lower electrode pad is-formed on a substrate base. A dielectric layer is formed on the substrate base by a build-up coating procedure. A hole is formed in the dielectric layer to expose the lower electrode pad, and a medium material is then filled into the hole. The medium material is ground to have a ground surface coplanar to the dielectric layer. A second metal wiring layer including an upper electrode pad is formed on the dielectric layer, the upper electrode pad covers the ground surface of the medium material and is parallel to the lower electrode pad so as to form an embedded capacitor.

In U.S. Pat. No. 6,746,508, entitled "Nanosized Intermetallic Powders," there is described the use of nanoparticles of intermetallic alloys such as FeAl, Fe3Al, NiAl, TiAl and FeCoV which exhibit a wide variety of interesting structural, magnetic, catalytic, resistive and electronic, and bar coding applications. The nanosized powders can be used to make structural parts having enhanced mechanical properties, magnetic parts having enhanced magnetic saturation, catalyst materials having enhanced catalytic activity, thick film circuit elements having enhanced resolution, and screen printed images such as magnetic bar codes having enhanced magnetic properties. In contrast to bulk FeAl materials which are nonmagnetic at room temperature, the FeAl nanoparticles exhibit magnetic properties at room temperature.

U.S. Pat. No. 6,740,701, entitled "Resistive Film", there is described a resistive film for use in a potentiometer. The film is in contact with a movable wiper. The film includes a cured polymer resin and a cured thermosetting resin. Conductive particles of carbon black and graphite are dispersed in the film. The conductive particles cause the resins to be electrically resistive. Carbon nano-particles are also dispersed in the film. The nano-particles increase the wear resistance of the resistive film and reduce electrical noise as the wiper moves across the film. In the preparation of an exemplary composition, a polymer solution is made by mixing 10-20 wt. percent of a polymer and 0-10 wt. percent thermosetting resin in 60-80 wt. percent N-methyl pyrrolidone, based upon the total composition. The polymer is mixed with both the conductive and nano-particles to form a paste with a fine particle size. At this point, surfactants and rheological additives may be added if desired to modify the properties of the resistive composition. The particle size range and viscosity of the paste is monitored to get a resistive paste suitable for application in position sensors. The milling time and milling quantity on the ball mill determines the final particle distribution, size and resulting rheology.

In U.S. Pat. No. 6,704,207, entitled "Device and Method for Interstitial Components in a Printed Circuit Board", issued Mar. 9, 2004, there is described a printed circuit board (PCB) which includes a first layer having first and second surfaces, with an above-board device (e.g., an ASIC chip) mounted thereon. The PCB includes a second layer having third and fourth surfaces. One of the surfaces can include a recessed portion for securely holding an interstitial component. A "via", electrically connecting the PCB layers, is also coupled to a lead of the interstitial component. The described interstitial components include components such as diodes, transistors, resistors, capacitors, thermocouples, and the like. In what appears to be the preferred embodiment, the interstitial component is a resistor having a similar size to a "0402" resistor (manufactured by Rohm Co.), which has a thickness of about 0.014 inches.

In U.S. Pat. No. 6,616,794, entitled "Integral Capacitance For Printed Circuit Board Using Dielectric Nanopowders" and issued Sep. 9, 2003, there is described a method for producing integral capacitance components for inclusion within printed circuit boards in which hydro-thermally prepared nano-powders permit the fabrication of dielectric layers that offer increased dielectric constants and are readily penetrated by micro-vias. In the method described in this patent, a slurry or suspension of a hydro-thermally prepared nano-powder and solvent is prepared. A suitable bonding material, such as a polymer, is mixed with the nano-powder slurry, to generate a composite mixture which is formed into a dielectric layer. The dielectric layer may be placed upon a conductive layer prior to curing, or conductive layers may be applied upon a cured dielectric layer, either by lamination or metallization processes, such as vapor deposition or sputtering.

In U.S. Pat. No. 6,544,651, entitled "High Dielectric Constant Nano-Structure Polymer-Ceramic Composite" and issued Apr. 3, 2003, there is described a polymer-ceramic composite having high dielectric constants formed using polymers containing a metal acetylacetonate (acacs) curing catalyst. In particular, a certain percentage of Co (III) may increase the dielectric constant of a certain epoxy. The high dielectric polymers are combined with fillers, preferably ceramic fillers, to form two phase composites having high dielectric constants. Composites having about 30 to about 90% volume ceramic loading and a high dielectric base polymer, preferably epoxy, were apparently found to have dielectric constants greater than about 60. Composites having dielectric constants greater than about 74 to about 150 are also mentioned in this patent. Also mentioned are embedded capacitors with capacitance densities of at least 25 nF/cm.sup.2, preferably at least 35 nF/cm.sup.2, most preferably 50 nF/cm.sup.2.

In U.S. Pat. No. 6,524,352, entitled "Method Of Making A Parallel Capacitor Laminate" and issued Feb. 25, 2003, there is defined a parallel capacitor structure capable of forming an internal part of a larger circuit board or the like structure to provide capacitance therefore. Alternatively, the capacitor may be used as an inter-connector to interconnect two different electronic components (e.g., chip carriers, circuit boards, and even semiconductor chips) while still providing desired levels of capacitance for one or more of said components. The capacitor includes at least one internal conductive layer, two additional conductor layers added on opposite sides of the internal conductor, and inorganic dielectric material (preferably an oxide layer on the second conductor layer's outer surfaces or a suitable dielectric material such as barium titanate applied to the second conductor layers). Further, the capacitor includes outer conductor layers atop the inorganic dielectric material, thus forming a parallel capacitor between the internal and added conductive layers and the outer conductors.

In U.S. Pat. No. 6,500,350, entitled "Formation of Thin Film Resistors" and issued Dec. 31, 2002, there is described a method for forming a patterned layer of resistive material in electrical contact with a layer of electrically conducting material. A three-layer structure is formed which comprises a metal conductive layer, an intermediate layer formed of material which is degradable by a chemical etchant, and a layer of resistive material of sufficient porosity such that the chemical etchant for the intermediate layer may seep through the resistive material and chemically degrade the intermediate layer so that the resistive material may be ablated from the conductive layer wherever the intermediate layer is chemically degraded. A patterned photo-resist layer is formed on the resistive material layer. The resistive material layer is exposed to the chemical etchant for the intermediate layer so that the etchant seeps through the porous resistive material layer and degrades the intermediate layer. Then, portions of the resistive material layer are ablated away wherever the intermediate layer has been degraded.

In U.S. Pat. No. 6,446,317, entitled "Hybrid Capacitor And Method Of Fabrication Therefore", and issued Sep. 10, 2002, there is described a hybrid capacitor associated with an integrated circuit package that provides multiple levels of excess, off-chip capacitance to die loads. The hybrid capacitor includes a low inductance, parallel plate capacitor which is embedded within the package and electrically connected to a second source of off-chip capacitance. The parallel plate capacitor is disposed underneath a die, and includes a top conductive layer, a bottom conductive layer, and a thin dielectric layer that electrically isolates the top and bottom layers. The second source of off-chip capacitance is a set of self-aligned via capacitors, and/or one or more discrete capacitors, and/or an additional parallel plate capacitor. Each of the self-aligned via capacitors is embedded within the package, and has an inner conductor and an outer conductor. The inner conductor is electrically connected to either the top or bottom conductive layer, and the outer conductor is electrically connected to the other conductive layer. The discrete capacitors are electrically connected to contacts from the conductive layers to the surface of the package. During operation, one of the conductive layers of the low inductance parallel plate capacitor provides a ground plane, while the other conductive layer provides a power plane.

In U.S. Pat. No. 6,396,387, entitled "Resistors For Electronic Packaging" and issued May 28, 2002, there are described thin layer resistors which are formed on an insulating substrate, which resistors may be embedded within a printed circuit board. Preferred resistive materials are homogeneous mixtures of metals, such as platinum, and dielectric materials, such as silica or alumina. Even minor amounts of dielectric material admixed with a metal significantly increase the resistance of the metal. Preferably, the resistive material is deposited on the insulating substrate by combustion chemical vapor deposition (CCVD). In the case of zero valence metals and dielectric material, the homogeneous mixture is achieved by co-deposition of the metal and dielectric material by CCVD. To form discrete patches of the resistive material, substantially any metal-based resistor material, including those based on the noble metals, can be etched away. Thus, a layer of resistive material may be covered with a patterned resist, e.g., an exposed and developed photo-resist, and exposed portions of the underlying layer of resistive material etched away. This patent also describes the formation of thin layer resistors including the insulating substrate, discrete patches of a layer of resistive material, and conductive material in electrical contact with spaced-apart locations on the patches of resistive material layer, such conductive material providing for electrical connection of the resistive material patches with electronic circuitry. Such structures of insulating material, resistive material, and conductive material may be formed by selective etching procedures.

In U.S. Pat. No. 6,395,996, entitled "Multi-layered Substrate With Built-In Capacitor Design" and issued May 28, 2002, there is described a multi-layered substrate having built-in capacitors which are used to decouple high frequency noise generated by voltage fluctuations between a power plane and a ground plane of a multi-layered substrate. At least one kind of dielectric material, which has filled-in through holes between the power plane and the ground plane and includes a high dielectric constant, is used to form the built-in capacitors.

In U.S. Pat. No. 6,370,012, entitled "Capacitor Laminate For Use In A Printed Circuit Board And As An Inter-connector" and issued Apr. 9, 2002, there is described a parallel capacitor structure capable of forming an internal part of a larger circuit board or the like structure to provide capacitance therefore. Alternatively, the capacitor may be used as an inter-connector to interconnect two different electronic components (e.g., chip carriers, circuit boards, and even semiconductor chips) while still providing desired levels of capacitance for one or more of said components. The capacitor includes at least one internal conductive layer, two additional conductor layers added on opposite sides of the internal conductor, and inorganic dielectric material (preferably an oxide layer on the second conductor layer's outer surfaces or a suitable dielectric material such as barium titanate applied to the second conductor layers). Further, the capacitor includes outer conductor layers atop the inorganic dielectric material, thus forming a parallel capacitor between the internal and added conductive layers and the outer conductors.

In U.S. Pat. No. 6,242,282, entitled "Circuit Chip Package and Fabrication Method", issued Jun. 5, 2001, there is described a method for packaging a chip which includes the steps of providing an interconnect layer including insulative material having a first side and a second side, initial metallization patterned on second side metallized portions of the second side and not on second side non-metallized portions of the second side, a substrate via extending from the first side to one of the second side metallized portions, and a chip via extending from the first side to the second side non-metallized portion. The method also includes positioning a chip on the second side with a chip pad of the chip being aligned with the chip via, and patterning connection metallization on selected portions of the first side of the interconnect layer and in the via so as to extend to the second side metallized portion and to the chip pad. About the chip is molded a "substrate" or other dielectric material.

In U.S. Pat. No. 6,207,595, entitled "Laminate and Method of Manufacture Thereof", issued Mar. 27, 2001, there is described a fabric-resin dielectric material for use in a laminate structure and method of its manufacture. The resulting structure is adaptable for use in a printed circuit board or chip carrier substrate. The resin may be an epoxy resin such as is currently used on a large scale worldwide for "FR-4" composites. A resin material based on bismaleimide-triazine (BT) is also acceptable, this patent further adding that more preferably, the resin is a phenolically hardenable resin material as is known in the art, with a glass transition temperature of about 145 degrees Celsius (C.).

In U.S. Pat. No. 6,150,456, entitled "High Dielectric Constant Flexible Polyimide Film And Process Of Preparations, issued Nov. 21, 2000, there is described a flexible, high dielectric constant polyimide film composed of either a single layer of an adhesive thermoplastic polyimide film or a multilayer polyimide film having adhesive thermoplastic polyimide film layers bonded to one or both sides of the film and having dispersed in at least one of the polyimide layers from 4 to 85 weight % of a ferroelectric ceramic filler, such as barium titanate or polyimide-coated barium titanate, and having a dielectric constant of from 4 to 60. The high dielectric constant polyimide film can be used in electronic circuitry and electronic components such as multilayer printed circuits, flexible circuits, semiconductor packaging and buried (internal) film capacitors In U.S. Pat. No. 6,084,306, entitled "Bridging Method of Interconnects for Integrated Circuit Packages", issued Jul. 4, 2000, there is described an integrated circuit package having first and second layers, a plurality of routing pads being integral with the first layer, a plurality of upper and lower conduits, respectively, disposed on the upper and lower surfaces of the first layer, one of the upper conduits electrically connected to one of the lower conduits, a plurality of pads disposed on the second layer, vias that electrically connect the pads to the lower conduits and a chip adhered to the second layer having bonding pads, at least one of which is electrically connected to one of the routing pads.

In U.S. Pat. No. 6,068,782, entitled "Individual Embedded Capacitors For Laminated Printed Circuit Boards" and issued May 30, 2000, there is described a method of fabricating individual, embedded capacitors in multilayer printed circuit boards. The method is allegedly compatible of being performed using standard printed circuit board fabrication techniques. The capacitor fabrication is based on a sequential build-up technology employing a first pattern-able insulator. After patterning of the insulator, pattern grooves are filled with a high dielectric constant material, typically a polymer/ceramic composite. Capacitance values are defined by the pattern size, thickness and dielectric constant of the composite. Capacitor electrodes and other electrical circuitry can be created either by etching laminated copper, by metal evaporation or by depositing conductive ink.

In U.S. Pat. No. 6,021,050, entitled "Printed Circuit Boards With Integrated Passive Components And Method Of Making Same," there is described a multi-layered printed circuit board having a plurality of buried passive elements and a method for producing the circuit board wherein the passive elements can include resistors, capacitors and inductors. The method includes the steps of manufacturing individual layers of the multi-layer printed circuit board with electrical circuits thereon and subsequently screening polymer inks having resistive, dielectric or magnetic values to form the resistors, capacitors and inductors. Each layer of the circuit board is cured to dry the polymer ink and thereafter the individual layers are bonded together to form the multi-layer board.

In U.S. Pat. No. 5,831,833, entitled "Bare Chip Mounting Printed Circuit Board and a Method of Manufacturing Thereof by Photo-etching", issued Nov. 3, 1998, there is described a method of manufacturing a "bare chip" multilayer printed circuit board in which arbitrary numbers of wiring circuit conductor layers and insulating layers are alternately stacked on one or both surfaces of a printed circuit board as a substrate, and a recessed portion with an upper opening capable of mounting and resin-encapsulating a bare chip part is formed on the surface of the printed circuit board. In what appears to be the preferred embodiment, one of the insulating layers is made from a photosensitive resin, and the bare chip part mounting recessed portion is formed by photo-etching the insulating layer made from the photosensitive resin.

In U.S. Pat. No. 5,426,263, entitled "Electronic Assembly Having a Double-sided Leadless Component", issued Jun. 20, 1995, there is described an electronic assembly which has a double-sided leadless component and two printed circuit boards. The component has a plurality of electrical terminations or pads on both opposing major surfaces. Each of the printed circuit boards has a printed circuit pattern that has a plurality of pads that correspond to the electrical terminations on both sides of the double-sided leadless component. The electrical terminals on one side of the component are attached to the pads on the first board and the electrical terminals on the other side of the leadless component are attached to the pads on the second board. The printed circuit boards are joined together to form a multilayered circuit board so that the double-sided leadless component is buried or recessed inside. The component is attached to the pads of the printed circuit board using solder.

In U.S. Pat. No. 5,280,192, entitled "Three-dimensional Memory Card Structure With Internal Direct Chip Attachment", issued Jan. 18, 1994, there is described a card structure which includes an internal three dimensional array of implanted semiconductor chips. The card structure includes a power core and a plurality of chip cores. Each chip core is joined to the power core on opposite surfaces of the power care, and each chip core includes a compensator core having a two dimensional array of chip wells. Each chip well allows for a respective one of the semiconductor chips to be implanted therein. Further, a compliant dielectric material is disposed on the major surfaces of the compensator core except at the bottoms of the chip wells. The compliant dielectric material has a low dielectric constant and has a thermal coefficient of expansion compatible with those of the semiconductor chips and the compensator core, so that thermal expansion stability with the chips and the compensator core is maintained.

In U.S. Pat. No. 5,162,977, entitled "Printed Circuit Board Having An Integrated Decoupling Capacitive Element" and issued Nov. 10, 1992, there is described a PCB which includes a high capacitance power distribution core, the manufacture of which is compatible with standard printed circuit board assembly technology. The high capacitance core consists of a ground plane and a power plane separated by a planar element having a high dielectric constant. The high dielectric constant material is typically glass fiber impregnated with a bonding material, such as epoxy resin loaded with a ferroelectric ceramic substance having a high dielectric constant. The ferroelectric ceramic substance is typically a nano-powder combined with an epoxy bonding material. According to this patent, the resulting capacitance of the power distribution core is sufficient to totally eliminate the need for decoupling capacitors on a PCB. Use of pre-fired and ground ceramic nano-powders in the dielectric layer poses obstacles for the formation of thru-holes (conductive holes permitting electronic communication between conductive layers of a PCB), however. Pre-fired and ground ceramic nano-powder particles have a typical dimension in the range of 500-20,000 nanometers (nm). Furthermore, the particle distribution in this range is generally rather broad, meaning that there could be a 10,000 nm particle alongside a 500 nm particle. The distribution within the dielectric layer of particles of different size often presents major obstacles to thru-hole formation where the thru-holes are of extremely small diameter, also referred to in the industry as micro-vias due to the presence of the larger particles. Another problem associated with pre-fired ceramic nano-powders is the ability for the dielectric layer to withstand substantial voltage without breakdown occurring across the layer. Typically, capacitance layers within a PCB are expected to withstand at least 300 volts (V) in order to qualify as a reliable component for PCB construction. The presence of the comparatively larger ceramic particles in pre-fired ceramic nano-powders within a capacitance layer prevents extremely thin layers from being used because the boundaries of contiguous large particles provide a path for voltage breakdown. This is even further undesirable because, as indicated by the equation cited above, greater planar capacitance may also be achieved by reducing the thickness of the dielectric layer. The thickness is thus limited by the size of the particles therein.

In U.S. Pat. No. 5,099,309, entitled "Three-dimensional Memory Card Structure With Internal Direct Chip Attachment", issued Mar. 24, 1992, there is described a memory card structure containing an embedded three dimensional array of semiconductor memory chips. The card structure includes at least one memory core and at least one power core which are joined together in an overlapping relationship. Each memory core comprises a copper-invar-copper (CIC) thermal conductor plane having a two dimensional array of chip well locations on each side of the plane. Polytetrafluoroethylene (PTFE) covers the major surfaces of the thermal conductor plane except at the bottoms of the chip wells. Memory chips are placed in the chip wells and are covered by insulating and wiring levels. Each power core comprises at least one CIC electrical conductor plane and PTFE covering the major surfaces of the electrical conductor plane. Provision is made for providing electrical connection pathways and cooling pathways along vertical as well as horizontal planes internal to the card structure.

In U.S. Pat. No. 5,079,069, entitled "Capacitor Laminate For Use In Capacitive Printed Circuit Boards And Methods Of Manufacture" and issued Jan. 7, 1992, there is described a capacitor laminate which allegedly serves to provide a bypass capacitive function for devices mounted on the PCB, the capacitor laminate being formed of conventional conductive and dielectric layers whereby each individual external device is allegedly provided with capacitance by a proportional portion of the capacitor laminate and by borrowed capacitance from other portions of the capacitor laminate, the capacitive function of the capacitor laminate being dependent upon random firing or operation of the devices. That is, the resulting PCB still requires the utilization of external devices thereon, and thus does not afford the PCB external surface area real estate savings mentioned above which are desired and demanded in today's technology.

In U.S. Pat. No. 5,016,085, entitled "Hermetic package for integrated circuit chips, issued May 14, 1991, there is described a hermetic package which has an interior recess for holding a semiconductor chip. The recess is square and set at 45 degrees with respect to the rectangular exterior of the package. The package uses ceramic layers which make up the package's conductive planes with the interior opening stepped to provide connection points. The lowest layer having a chip opening therein may be left out of the assembly to provide a shallower chip opening recess. This of course is not the same as an internally formed capacitance or semiconductor component of the nature described above, but it does mention internal ceramic layers for a specified purpose as part of an internal structure.

The teachings of the above patents, publications and cited co-pending applications are incorporated herein by reference.

Commercially available dielectric powders which have been used in internal conductive structures such as mentioned in some of the above patents are-known to be produced by a high-temperature, solid-state reaction of a mixture of the appropriate stoichiometric amounts of oxides or oxide precursors (e.g., carbonates, hydroxides or nitrates) of barium, calcium, titanium, and the like. In such calcination processes, the reactants are wet-milled to accomplish a desired final mixture. The resulting slurry is dried and fired at elevated temperatures, sometimes as high as 1,300 degrees Celsius (C), to attain the desired solid state reactions. Thereafter, the fired product is milled to produce a powder. Although the pre-fired and ground dielectric formulations produced by solid phase reactions are acceptable for many electrical applications, these suffer from several disadvantages. First, the milling step may serve as a source of contaminants, which can adversely affect electrical properties. Second, the milled product may consist of irregularly shaped fractured aggregates which are often too large in size and possess a wide particle size distribution, 500-20,000 nm. Consequently, films produced using these powders are limited to thicknesses greater than the size of the largest particle. Thirdly, powder suspensions or composites produced using pre-fired ground ceramic powders must be used immediately after dispersion, due to the high sedimentation rates associated with large particles. The stable crystalline phase of barium titanate for particles greater than 200 nm is tetragonal and, at elevated temperatures, a large increase in dielectric constant occurs due to a phase transition. It is thus clear that methods of making PCBs which rely on the advantageous features of using nano-powders as part of the PCB's internal components or the like, such as those described in selected ones of the above patents, possess various undesirable aspects which are detrimental to providing a PCB with optimal functioning capabilities when it comes to internal resistance, capacitance or other electrical properties.

The above is particularly true when the desired final product attempts to meet today's miniaturization demands, including the utilization of high density patterns of signal lines and thru-holes (definition below) therein. As is known, extremely close positioning of such thru-holes and signal lines may result in discontinuities occurring therein, which will adversely affect the successful operation of the product, especially at high frequencies (which are also demanded in many products today). Such discontinuities may also result from what is referred to as thru-hole "stub", in which energy from the high speed signals passing through such thru-holes "bounces off" the end of the thru-hole (called the "stub"). These reflections and resonances may serve to contribute to signal degradation, particularly, as stated, when the signal lines and/or thru-holes are positioned in close proximity to one another. The successful elimination of such discontinuities is thus highly desired for many of today's circuitized substrates, especially those intended to pass high speed signals using high density patterns of thru-holes and/or signal lines.

The present invention is particularly directed to substantially eliminating many of such discontinuities by the provision of an internal resistor material as part of the internal circuit structure. By doing so, the invention is able to reduce capacitance and increase high frequency resistance at strategic locations within the circuit, thus improving system performance. It is believed that an invention possessing such features, as well as others discernible from the teachings herein, will constitute a significant advancement in the art.

OBJECTS AND SUMMARY OF THE INVENTION

It is, therefore, a primary object of the present invention to enhance the circuitized substrate art by providing a circuitized substrate having the advantageous features taught herein.

It is another object of the invention to provide a method of making such a circuitized substrate which can be accomplished in a relatively facile manner and at relatively low costs.

It is still another object of the invention to provide an electrical assembly capable of using such a circuitized substrate and thus benefiting from the several advantageous features thereof.

It is yet another object of the invention to provide an information handling system capable of utilizing a circuitized substrate as part thereof to thus also benefit from the several advantageous features thereof.

According to one aspect of the invention, there is provided a method of making a circuitized substrate having circuitry including a resistor as part thereof the method comprising the steps of providing a first dielectric layer, forming a first electrical conductor on the first dielectric layer, forming an opening within the first electrical conductor, positioning a quantity of resistor material within the opening, forming a second dielectric layer substantially over the quantity of resistor material within the opening, forming a second electrical conductor on the second dielectric layer, and forming an electrical connection between the second and first electrical conductors, the quantity of resistor material serving to substantially reduce the capacitance between the electrical conductors and increase the high frequency resistance in the electrical connection between the electrical conductors.

According to another aspect of the invention, there is provided a circuitized substrate comprising a first dielectric layer, a first electrical conductor positioned on the first dielectric layer and including an opening therein, a quantity of resistor material within the opening, a second dielectric layer positioned substantially over the quantity of resistor material, a second electrical conductor positioned on the second dielectric layer, and an electrical connection between the second and first electrical conductors, the quantity of resistor material serving to substantially reduce the capacitance between the first and second electrical conductors and increase the high frequency resistance in the electrical connection between the first and second electrical conductors.

According to yet another aspect of the invention, there is provided an electrical assembly comprising a circuitized substrate including a first dielectric layer, a first electrical conductor positioned on the first dielectric layer and including an opening therein, a quantity of resistor material within the opening, a second dielectric layer positioned substantially over the quantity of resistor material, a second electrical conductor positioned on the second dielectric layer, and an electrical connection between the second and first electrical conductors, the quantity of resistor material serving to substantially reduce the capacitance between the first and second electrical conductors and increase the high frequency resistance in the electrical connection between the first and second electrical conductors, and at least one electrical component positioned on and electrically coupled to the circuitized substrate.

BEST MODE FOR CARRYING OUT THE INVENTION

Figure 1:
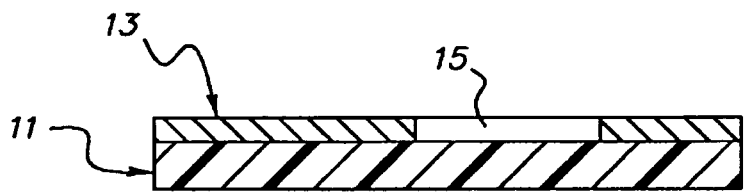
FIGS. 1-7 are much enlarged, side elevational views which illustrate the basic steps of making a circuitized substrate including at least one internal resistor, according to one embodiment of the invention.

For a better understanding of the present invention, together with other and further objects, advantages and capabilities thereof, reference is made to the following disclosure and appended claims in connection with the above-described drawings. Like figure numbers are used from FIG. to FIG. to identify like elements in these drawings.

By the term "circuitized substrate" as used herein is meant to include substrates having at least one (and preferably more) dielectric layer(s) and at least one (and preferably more) metallurgical conductive layer(s). Examples include structures made of dielectric materials such as fiberglass-reinforced epoxy resins (some referred to as "FR-4" dielectric materials in the art), polytetrafluoroethylene (Teflon), polyimides, polyamides, cyanate resins, photo-imagable materials, and other like materials wherein the conductive layers are each a metal layer (e.g., power, signal and/or ground) comprised of suitable metallurgical materials such as copper, but may include or comprise additional metals (e.g., nickel, aluminum, etc.) or alloys thereof. Further examples will be described in greater detail herein-below. Examples of such circuitized substrates, as mentioned above, include printed circuit boards (or cards) and chip carriers. It is believed that the teachings of the instant invention are also applicable to what are known as "flex" circuits (which use dielectric materials such as polyimide) and those which use ceramic or other non-polymer type dielectric layers, one example of the latter being what are referred to as multi-layered ceramic (MLC) modules adapted for having one or more semiconductor chips mounted thereon.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. Perhaps the most well known such assembly is the conventional printed circuit board (PCB) typically having several such external electrical components thereon (including possibly one or more chip carriers) and coupled to the internal circuitry of the PCB and/or each other.

By the term "electrical component" as used herein is meant components such as semiconductor chips and the like which are adapted for being positioned on the external conductive surfaces of such substrates and electrically coupled to the substrate for passing signals from the component into the substrate whereupon such signals may be passed on to other components, including those mounted also on the substrate, as well as other components such as those of a larger electrical system which the substrate forms part of.

By the term "information handling system" as used herein shall mean any instrumentality or aggregate of instrumentalities primarily designed to compute, classify, process, transmit, receive; retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more PCBs, chip carriers, etc. as integral parts thereof. For example, a PCB typically used includes a plurality of various components such as chip carriers, capacitors, resistors, modules, etc. mounted thereon. One such PCB can be referred to as a "motherboard" while various other boards (or cards) may be mounted thereon using suitable electrical connectors.

By the term "micro-particles" is meant particles having an average size of from about one micron (1000 nanometers) to about fifty microns (50000 nanometers).

By the term "nano-particles" as used herein is meant particles with an average size of from about 0.01 micron (ten nanometers) to about one micron (1000 nanometers).

(The materials used to form the resistors defined herein are understood to include powders having "micro-particles" and/or "nano-particles" as part thereof.)

By the term "screen printing" as used herein is meant to include both screen and stencil printing processes as conventionally used today. These involve the use of a screen or stencil through which a desired material, e.g., inks, conductive compositions, etc., are deposited, e.g., using a squeegee.

By the term "thru-hole" as used herein is meant to include what are also commonly referred to in the industry as "blind vias" which are openings typically from one surface of a substrate to a predetermined distance therein, "internal vias" which are vias or openings located internally of the substrate and are typically formed within one or more internal layers prior to lamination thereof to other layers to form the ultimate structure, and "plated through holes" (also known as PTHs), which typically extend through the entire thickness of a substrate. All of these various openings form electrical paths through the substrate and often include one or more conductive layers, e.g., plated copper, thereon. These openings are formed typically using mechanical drilling or laser ablation.

In FIG. 1, a layer 11 of dielectric material is provided. The dielectric material for layer II may be selected from those listed above, and in one example, may be the aforementioned fiberglass-reinforced epoxy resin ("FR4") material. Atop layer 11 is at least one electrical conductor 13, preferably of copper or copper alloy. In one embodiment, conductor 13 is formed from a larger sheet of material bonded (e.g., laminated in solid sheet form using conventional PCB processing) to layer 11 and then subjected to known photolithographic processing used in the PCB industry, to finally define the conductor's configuration. Briefly, in such a process, a photoresist is applied, patterned and developed (removed in selected locations). An etchant (e.g., cupric chloride) is then applied to the exposed surfaces and the material therein is etched away. In the example shown in FIG. 1, conductor 13 includes an opening 15 formed (preferably by said etching) therein, but may be of any other acceptable configuration, including more openings, as well as adjacent signal lines, pads, etc. Alternatively, conductor 13 may be formed using conventional sputtering operations in which a seed layer is typically provided following which at least one conductive layer is sputtered there-over. In these embodiments, layer 11 may possess a thickness of from about one mil to about twenty mils (a mil being one-thousandths of an inch) while conductor 13 may include a thickness of from about 0.2 mils to about 2.5 mils. As understood from the following, conductor 13 is to form part of a circuit for the invention. More particularly, the conductor, with opening 15 therein, may be described as an "anti-pad" meaning that a signal conducting member (e.g., a plated thru-hole, as defined in greater detail below) will pass through the opening and not be in direct electrical contact with the conductor.

Figure 2:
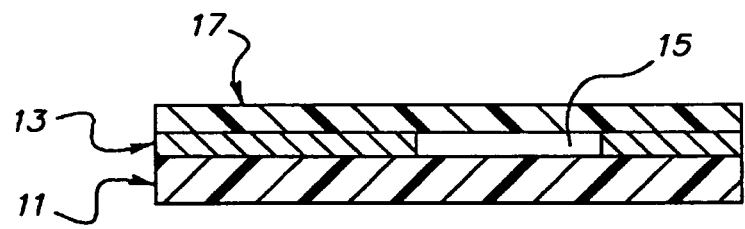

The next step, prior to which a second dielectric layer 17 (FIG. 2) is to be secured atop conductor 13, is an optional step and involves treating the upper surface of conductor 13 to enhance the adhesion of the dielectric layer 17 to the conductor's surface. To accomplish this, it is preferred to subject the exposed, upper surface to an oxide (or oxidation) alternative process. One good example of such a process involves exposing the conductor to what is referred to as a "BondFilm" solution currently available on the marketplace under this name from Atotech Deutschland GmbH, an international company having a U.S.A. business address at 1750 Overview Drive, Rock Hill, S.C. BondFilm solution is comprised primarily of three components: (1) sulfuric acid; (2) hydrogen peroxide; and (3) copper, as well as additional Atotech Deutschland GmbH proprietary constituents. As stated, this process is also referred to as an oxide alternative process, meaning that it does not result in the formation of oxide layers on the treated material. By way of example, the RMS roughness (a standard measurement means) value for the upper surface of conductor 13 after subjecting it to the BondFilm "process" may be about 0.6 microns with a peak of about 1.2 to about 2.2 microns. The BondFilm process involves immersing the conductor in the solution for a period of from about 5 to about 120 seconds at a solution temperature of about 20 to 35 degrees Celsius (C). As part of this treatment, the external surfaces of the conductor are initially cleaned and degreased, following which a micro-etch of the surface occurs. Finally, a thin organic coating is applied. In one example, this thin organic coating is benzotriazole and possesses a thickness of from about 50 Angstroms to about 500 Angstroms. This thin coating remains on the external surfaces of the conductor during subsequent processing. Because it is so thin, it is not shown in the drawings. Other examples of alternative oxide processes which can be utilized with the invention are known in the industry and further description is not deemed necessary.

Figure 3:
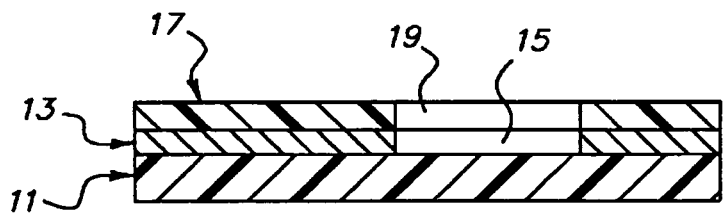

Second dielectric layer 17 is now applied, preferably as a solid layer and using a conventional lamination process known in PCB manufacturing. Layer 17 is preferably a photo-imagable material, several examples of which are known in the art. One example is an ASMDF (Advanced Soldermask Dry Film). This composition may include a solids content of from about 85 to about 90%, such solids comprising about 27% PKHC (a phenoxy resin), 41% of Epirez 5183 (a tetra-bromobisphenol A), 23% of Epirez SU-8 (an octafunctional epoxy bisphenol A formaldehyde novolac resin), 54% UVE 1014 photo-initiator; 0.07% ethylviolet dye; 0.03% FC 430 (a fluorinated polyether nonionic surfactant from 3M Company), and about 4% Aerosil 380 (an amorphous silicon dioxide from the aforementioned Degussa Corporation) to provide the solid content. A solvent is present from about 11 to about 13.5% of the total photo-imagable dielectric composition. This composition is known in the art and further description is not deemed necessary. As stated, several photo-imagable materials may be used, and the invention is not limited to the above. The dielectric layer taught herein may be typically about 2 mils to about 4 mils thick, but also thicker or thinner if desired. After bonding to the upper surfaces of conductor 13, it is photo-imaged (or photo-patterned), and developed to reveal the desired circuit pattern, in this case at least one opening 19 (FIG. 3) of the same diameter as opening 15 lying immediately there-under. Opening 19 may actually be slightly larger than opening 15 for thin (around 0.2 mils) conductors (13). The dielectric material which is to form layer 17 may be curtain-coated or screen-applied, or it may be supplied as dry film. Final cure of the photo-imagable material provides a toughened base of dielectric on which desired electrical circuitry (e.g., signal lines or pads) may be formed. As defined below, it is not necessary to form such circuitry at this time but is more preferable to add yet a third dielectric layer (defined below) prior to such additional circuitry. In one example, layer 17 may be two mils thick.

Figure 4:
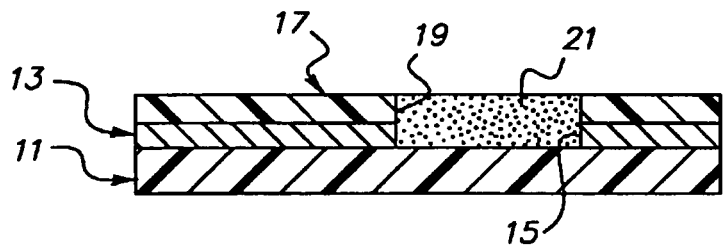

In FIG. 4, a quantity of resistor material 21 is deposited within aligned openings 15 and 19, preferably using screen printing (which, per the definition provided above, may include stencil printing as well as conventional screen printing). Several examples of this material are provided in detail below (see the seven Examples below). Briefly, this resistor comprises a polymer resin (e.g., a cycloaliphatic epoxy resin) and a quantity of metal powder material which may be comprised of one or more metals, each having particles of nano-particle and/or micro-particle size therein. In the first of the Examples below, resistor material 21 may include only silver particles in the resin mix, while in the second Example, only copper powder may be used in the resin. In the last five Examples, various combinations of copper, graphite and silver are included in the resin. The Examples illustrate how it is possible to provide differing resistances in the eventually formed resistors. The invention is able to provide resistors with resistance readings from about 120 milliohms (m$\Omega$) to about 120 mega ohms (M$\Omega$), the typical range of resistances for resistors used in PCB and chip carrier applications. It is understood that the invention is capable of providing resistors with resistance readings outside the above range, and the invention is not limited to such a range. It is also understood that the invention is not limited to using only copper and silver as the metals, as others are also possible. In the following Examples, the metal powder(s) used each had particles of from about 0.07 microns to about five microns in size. Here again, the invention is not limited to such sizes and areas.

One purpose of the metal component in the resistor composition 21 is, understandably, to establish the resistance of the formed circuit line including the resistor material as part thereof. It also assures improved electrical characteristics of the resistor (e.g. reduced dielectric loss, improved temperature and frequency stability, etc.). Still another purpose of the metal component is to establish the coefficient of thermal expansion (CTE) of the final mixture such that the mixture's CTE more closely approximates the CTE of the final (laminated) substrate and the conductors to which it is joined. The addition of the metal component to the mixture is, therefore, a very important feature of this invention. An important advantage of such closer CTE values is reduced stress within the resulting laminated substrate during substrate operation. Most significantly, as explained above, the resistor material, when positioned as shown and thus part of an internal circuit for a circuitized substrate, serves to substantially reduce the capacitance between a pair of electrical conductors (conductor 13 being one of these) and increase the resistance in a formed electrical connection between both electrical conductors. Further explanation is provided below.

Significantly, the metal powders used herein are not fired, and, equally significant, are of such a small size so as to enable effective formation of resistive structures (including when used in openings in the dielectric as shown in FIG. 4) of such small scale that high density circuit patterns, including those with thru-holes of the type defined above, may be formed. Such thru-holes may be of extremely small diameter (in one example, as small as one to two mils) to thereby assure such miniaturized, high density circuit patterns. As indicated, such miniaturization is deemed extremely important with respect to the designs of many present day circuitized substrates. In accomplishing printing of this resistor material 21, a screen or stencil (not shown) is positioned over layer 17 and the material is forced there-though, e.g., using a squeegee or blade. Material 21 substantially fills openings 15 and 19 and thus physically contacts the respective ends of conductor 13. In one embodiment, resistor material 21 may be deposited in paste-like form. However, it is also possible to apply material 21 as a liquid, dispensing it through a suitable nozzle (not shown) to fill openings 15 and 19. Use of ink jet printing apparatus having nozzles associated therewith may be used for this. Following dispense, resistor material 21 is now "B-staged" (heated in an appropriate oven such as a conventional convection oven) to raise it to a more hardened state than when dispensed. In one example, material 21 may be heated to a temperature of about 190 degrees Celsius for a period of about two hours. The resulting metal particles of resistor material 21 so formed may thus include an oxide coating thereon or may include a coating of the polymer resin material which forms part of the composition as defined. As such, these particles do not form a single continuous conductive path through the resistor material 21.

In the embodiment shown in FIG. 4, both openings 15 and 19 possessed an internal diameter of about sixteen mils and a total quantity of about 0.09 milligrams of the resistor material 21 was deposited therein.

In another example, material 21 may include a polymer resin as defined herein and a mixture of at least one metal component as defined above and at least one high surface area ceramic component, the nano-particles of the high surface area ceramic component having a particle size substantially within the range of from about 0.01 microns to about 10 microns and a surface area within the range of from about 1 to about 1500 square meters per gram. Another resistor material adapted for use herein is a material which includes a polymer resin as defined and a mixture of at least one metal coated ceramic component, the particles of the metal coated ceramic component having a particle size substantially within the range of from about 0.01 microns to about 10 microns. In this embodiment, it is thus understood that the ceramic component is coated with the metal component, to give a mixture including particles of a combined structure of both components. In yet another embodiment, the resistor material may include a polymer resin of the type defined herein and at least one oxide coated metal component as defined above, the particles of the oxide coated metal component preferably having a particle size substantially within the range of from about 0.01 microns to about 10 microns. Another acceptable resistor material for use herein includes a polymer resin as defined herein and a mixture of at least one metal component and at least one transparent oxide component. In this mixture, the particles of the transparent oxide component preferably include a particle size substantially within the range of from about 0.01 microns to about 10 microns, and a surface area within the range of from about 1 to about 100 square meters per gram. Still further, a resistor material having the unique properties defined herein may include a polymer resin as defined herein and a mixture of at least one metal component and at least one doped manganite component. In such a mixture, the nano-particles of the doped manganite component preferably have a particle size substantially within the range of from about 0.01 microns to about 10 microns and a surface area within the range of from about 1 to about 100 square meters per gram. For the above embodiments wherein the material includes at least one metal component and the at least one ceramic component is a ferroelectric ceramic or a high surface area ceramic, the mixture may further include a carbon nanotube component. These may be in the form of polymer thick film resistors or epoxy-metal (gold, copper, copper-tin) coated polymer sphere based resistors. Sputtering may also be used to deposit the resistor material, using a physical mask. Some typical metal alloys for such sputtered resistors include NiP (nickel phosphorous), NiCr (nickel chromium), NiCrAlSi (nickel chromium, aluminum, silicon) and TaN (tantalum nitride). Sputtered and printed resistors may also be used in combination, e.g., where a portion of resistor material is sputtered atop an already printed portion of resistor material.

Figure 5:
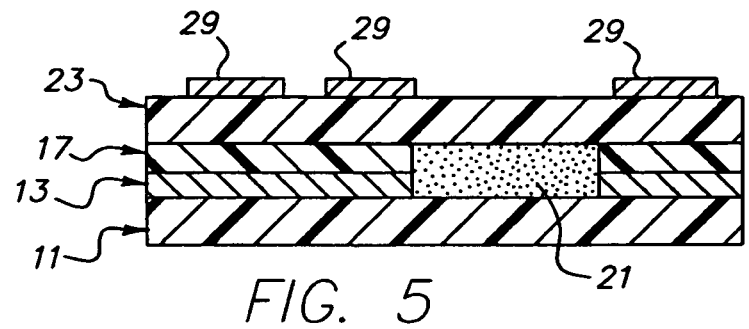

In FIG. 5, a third dielectric layer 23 is positioned over layer 17 and the now partly cured resistor material 21, said material cured enough to fully support such a layer 23 thereon. Layer 23 may be of any of the above dielectric materials, including photoimagable material as is layer 17. In a preferred embodiment, layer 27 is of the conventional "FR4" reinforced resin material and is applied using conventional PCB lamination processing. During such lamination, the temperature of the process also serves to finally (fully) cure the resistor material 21. In one example, this temperature range may be from about 180 degrees C. to about 380 degrees C. Lamination pressures within the range of 200 pounds per square inch (p.s.i.) to 2500 p.s.i. may be successfully utilized as part of such lamination. It is understood, however, that material 21 may be fully cured prior to layer 23 positioning, e.g., heated to a higher temperature than used to raise it to the "B-stage" described above. The invention is thus able to accommodate both possibilities, adding to the versatility of the process defined herein. In one example, layer 23 is four mils thick. In the case where layer 17 might not be used, layer 23 will actually serve as the second dielectric layer. When layer 23 is used as shown in FIGS. 4-7, layer 17 may be referred to as an interim dielectric layer, meaning that it is between the initial dielectric layer 11 and the dielectric layer 23 which functions to cover the resistor material.

Further in FIG. 5, it is desirable to form a plurality of conductors 29 on layer 23, these being signal lines or pads, depending on operational requirements for the final product. Conductors 29 form a circuit pattern on layer 23 which may or may not for part of the circuitry associated with the formed resistor as defined herein. This circuit pattern is shown here to illustrate the possibility of adding such circuitry at this point in the process, if desired. In one example, the circuitry is formed from a copper foil laminated to layer 23 and then subjected to conventional photolithographic processing as was used above. Other approaches are of course possible, including sputtering, and further description is not deemed needed here. In this example, each conductor had a thickness of about 1.5 mils and was formed of copper or copper alloy. For ease of description, these conductors may also be referred to herein as "third" conductors.

Figure 6:
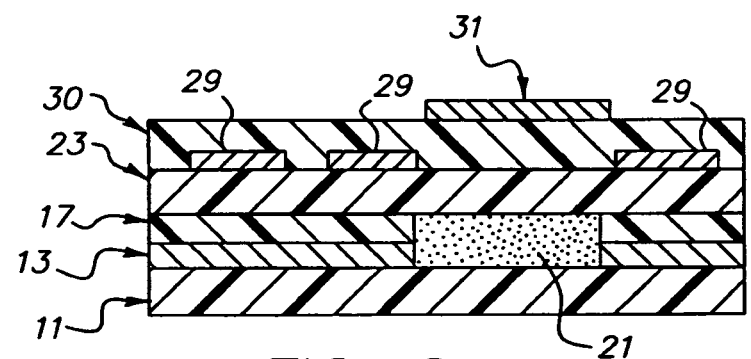

In FIG. 6, another dielectric layer 30 is formed over conductors 29 and on the upper surface of layer 23. Layer 30 is preferably the aforementioned "FR4" material but maybe of any of the dielectric materials cited above, including a photoimagable material. Layer 30, if of the "FR4" material, is deposited in a single layer form and bonded in place using conventional lamination processing. In one example, pressures within the range of 200 pounds per square inch (p.s.i.) to 2500 p.s.i. and temperatures of from about 180 degrees C. to about 380 degrees C. may be used as part of such lamination processing. Notably, these elevated temperatures do not adversely affect the resistor material 21. In one example, layer 30 may be four mils thick. Following successful bonding of layer 31, a "second" (relative to the first electrical conductor 13) electrical conductor 31 is formed on layer 30. Conductor 31 is preferably formed using conventional photolithographic processing following deposition of a single sheet of the conductor (preferably copper or copper alloy) onto layer 30. It is understood of course that many such conductors 31 may be formed, as well as other conductive elements such a signal lines or pads, all to form part of a single layer of circuitry at this location in the invention. Conductor 31 may be 1.5 mils thick and, as shown, is located over resistor material 21.

Although two dielectric layers 23 and 30 are described as being positioned over resistor material 21, in the broader aspects of this invention, it is only necessary to position one such dielectric layer. Further, because layers 23 and 30 will likely "blend" together along the facing edges thereof due to the relatively high heat and pressure associated with lamination processing, it is also possible to describe these combined layers as now being an integral layer. It is also possible in this invention to omit layer 23 and instead use only layer 30 as the second dielectric layer, that being the layer having the invention's second electrical conductor(s) thereon. In this regard, layer 23 may serve as the "second" dielectric layer with one of the conductors 29 forming the second conductor, and layer 30 (and conductor 31) omitted entirely. Finally, as also stated above, the dielectric layer 17, if used, is what might be referred to also as an interim dielectric layer, being formed following formation of conductor 13 (including with its opening 15 therein) and prior to positioning of dielectric layer 23.

The structure of FIG. 6 is now subjected to a drilling operation in which at least one opening 35 is formed as shown. Opening 35 may be formed using mechanical or laser drilling, one of these being the use of an Ng-YAG laser. In one embodiment, opening 35 may possess a diameter of eight mils and extends through the entire thickness of the FIG. 6 (and now FIG. 7) structure. This opening passes through the top conductor 31 and through the opening 15 within the initial conductor 13, thereby not directly contacting the internal walls of conductor 13. Significantly, this opening passes directly through (and thus engages) the resistor material 21. Following drilling, the internal walls of the opening are metallized, preferably using a conventional electroplating operation used in plating PCB thru-holes. A preferred electroplating process used in the formation of known PTHs may be used here, in which a first thin layer of palladium seed is applied, followed by a thin layer of electro-less copper, and finally, a thicker layer of electrolytic copper, resulting in the formation of a thin layer 37 (e.g., about 0.5 mils thick) on the openings internal walls. As is understood, other metallurgies and thicknesses are possible. This conductive material thus provides an electrical path from the top conductor 31 down through the substrate to the resistor material 21, and thus the other conductor 13. The opening and plated conductive material thereby forms a thru-hole 41, which, in the FIG. 7 embodiment, extends through the full thickness of the structure. This circuit path for the substrate thus includes a resistor as part thereof. As understood, the invention as defined herein may result in several such circuits being formed, and the invention is not limited to a single circuit and a single resistor as shown. In fact, the invention may provide more than one resistor per circuit, if desired.

Figure 7:
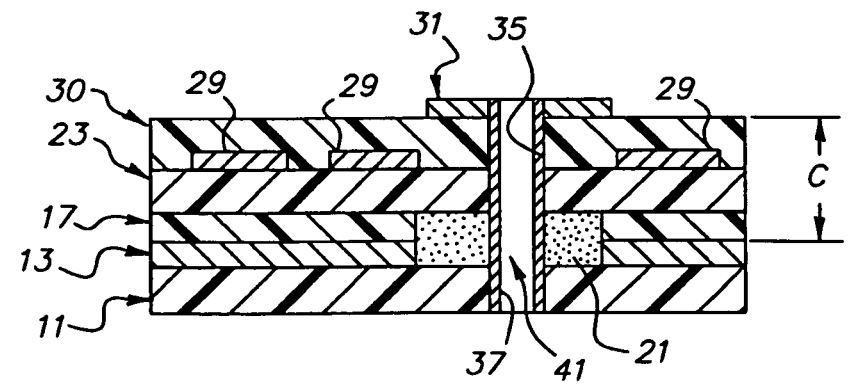

There are distinctive advantages of the circuit path (and structure) of FIG. 7, especially when there is a concern for performance degradation as a result of discontinuities (mentioned above) in the signal path through the circuit, as is always the concern for circuit designers of high density circuit patterns as taught herein. In the circuit of FIG. 7, there is the advantage of utilizing a material (resistor material 21) which possesses less capacitance than the dielectric material (layer 17) it replaces, thereby decreasing the capacitance in the circuit between conductors 13 and 31. In one example, the resulting capacitance (indicated by dimension "C" in FIG. 7) measured as low as from about 0.05 picofarads to about 0.22 picofarads. This design also reduces the signal energy that will reflect from the open end of the thru-hole 41 (that end which extends through dielectric layer 11). Significantly, and as evidenced by the results defined below in the Examples), the resistance value is very carefully selected so as to draw very little energy from the signal passing through the circuit. By way of example, a 50-ohm impedance signal line (path) is not affected significantly by 100,000 ohms in parallel, but the unwanted energy which travels down the thru-hole 41 is strongly affected by the additional 100,000 ohms because the thru-hole is open at the lower end. Therefore, much of the signal energy in this "stub" (end portion) will pass through the resistor material instead of "bouncing off" the open end. There has thus been a reduction in performance degradation by the addition of the resistor material and making it part of the circuit in this invention. Accordingly, data is transferred faster in the circuitized substrate in comparison to similar structures sans a resistor. The careful, precise selection of resistance values for this circuit is enhanced by the use of resistor materials including nano-particles and/or micro-particles as part thereof, in addition to using the defined screen printing operation to accomplish precise deposition thereof. Of further significance, these advantages are made possible without significant additional cost to the process of making the invention. As further understood from the teachings herein, the internal (or embedded) resistor formed within the substrate is uniquely able to provide such resistances in a variety of circuit combinations, or, simply, within only one circuit. It is further understood that the examples described and shown herein are not meant to limit the invention, as many additional possibilities exist and are well within the scope of one skilled in the art. Again, this invention thereby represents a significant advancement in the art.

Figure 8:
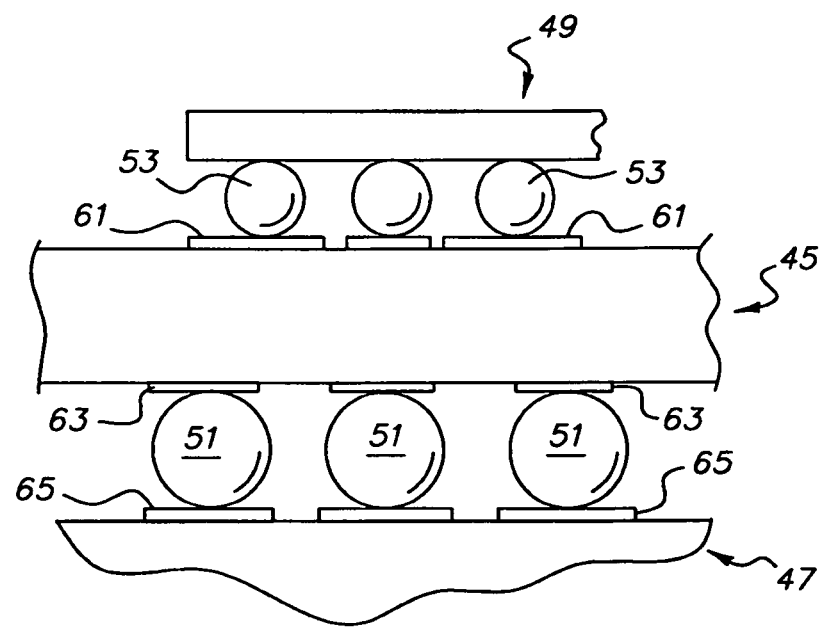
FIG. 8 is a partial perspective view, partially in section, of an electrical assembly according to one embodiment of the invention, this assembly being adapted for using one or more of the circuitized substrates of the instant invention.

FIG. 8 represents examples of the structures defined herein-above, the assembly referenced by the numeral 45 being a chip carrier, while the assembly represented by the numeral 47 is a PCB. Each is capable of including one or more internal resistors of the type defined above as part thereof. Both such PCB and chip carrier assemblies are produced and sold by the Assignee of the invention. In the embodiment (assembly) of FIG. 8, the chip carrier 45 is mounted on and electrically coupled to PCB 47 using a plurality of solder balls 51 (preferably of conventional tin-lead composition), the chip carrier 45 in turn having a semiconductor chip 49 positioned thereon and electrically coupled to the carrier using the second plurality of solder balls 53 (also preferably of conventional tin-lead composition). Therefore, there are two electrical assemblies shown in FIG. 8, one being the carrier-chip assembly and the other the PCB-carrier assembly (which inherently includes chip 49). The structure in FIG. 8 may also include a heat sink (not shown) thermally coupled to chip 49, e.g., using a conductive paste, and positioned on the upper surface of carrier 45 by appropriate standoffs, as is known in the art. It is also within the scope of those skilled in the art to utilize an encapsulant material (not shown) to substantially encase the chip and also to possibly eliminate the need for the heat sink if such an encapsulant material is used. Encapsulant material is also possible about the lower pluralities of solder balls 51 and 53. It is even further within the scope of the invention to couple chip 49 using conventional wire-bonding in which a plurality of fine wires (not shown) are bonded between chip conductor sites and corresponding conductor pads on the underlying substrate. If solder balls 53 are used, these interconnect contact sites (not shown) on the chip's underside to corresponding pads 61 on carrier 45.

Similarly, solder balls 51 interconnect pads 63 on the carrier's undersurface with pads 65 on the upper surface of PCB 47. Such pads are typically of copper or copper alloy and are known in the PCB art.

In the particular example shown in FIG. 8, it is possible for one or more of the upper pads 61 to be coupled to corresponding ones of the lower pads 63 to form individual circuit paths there-between. One or more of these circuit paths may include one or more of the resistors as taught herein.

Electrical assemblies including circuitized substrates of the type formed herein may be utilized in what are referred to in the art as "information handling systems" (defined above). Well known examples of such "systems" include personal computers, a mainframe computers and computer servers. Other types of information handling systems known in the art of this type may also utilize the teachings of this invention.

The circuitized substrate or substrates as formed in accordance with the teachings herein, each including one or more internal resistors as taught above, may be utilized in the system, e.g., as a "mother board" or as one or more individual PCBs.

The following Examples represent various combinations of resistor materials and processes used to form resistors according to various aspects of the invention. These are understood to be examples only and not limiting of the scope of this invention. It is clearly seen from these Examples that a relatively broad range of resistance values may be obtained using the teachings herein. Examples 1-5 represent micro-particle based resistors and Examples 6 and 7 represent nano-particle based resistors.

Example One

Fifty grams (gm) of cycloaliphatic epoxy resin (e.g., one sold under product designation "ERL-4211" by the Union Carbide Corporation, Danbury, Conn.) was mixed with about 50 gm of hexahydro-4-methylphthalic anhydride and 0.4 gm N,N dimethyl benzylamine. The mixed solution was stirred for approximately ten minutes to assure uniform mixing. Fifty gm of silver powder available from Degussa Corporation (having a business location at 379 Interpace Parkway, Parsippany, N.J.) was added to 7.5 gm of the mixed solution and formed into a printable paste. The silver powder included particles with an average size of about five microns. A layer of this paste material was then printed onto a copper substrate. This layer was then cured at approximately 190 degrees Celsius (C) for about two hours. The resistance of the cured resistors (3 inch long and 0.003 square inch cross section area) measured about 120 milliohms (mΩ).

Example Two

Fifty gm of the "ERL-4211" cycloaliphatic epoxy resin was mixed with about fifty gm of hexahydro-4-methylphthalic anhydride and 0.4 gm N, N dimethyl benzylamine. The mixed solution was stirred for about ten minutes to assure uniform mixing. Fifty gm of copper powder was added to 7.5 gm of the mixed solution and formed into a printable paste. The copper powder included particles with an average size of about four microns. A layer of this paste material was printed onto a copper substrate. This layer was then cured at approximately 190° C. for about two hours. The resistance of the cured resistors (3 inch long and 0.003 square inch cross section area) measured about 120 Mega ohms (MΩ).

Example Three

Fifty gm of the "ERL-4211" cycloaliphatic epoxy resin was mixed with about fifty gm of hexahydro-4-methylphthalic anhydride and 0.4 gm N,N dimethyl benzylamine. The mixed solution was stirred for about ten minutes to assure uniform mixing. Thirty-eight gm of copper and twelve gm of silver powder was added to 7.5 gm of the mixed solution and formed into a printable paste. The average particle sizes for the copper and silver powders ranged from about four to about five microns in diameter. A layer of this paste material was printed onto a copper substrate. This layer was then cured at approximately 190° C. for about two hours. The resistance of the cured resistors (3 inch long and 0.003 square inch cross section area) measured about 70 Mega ohms (MΩ).

Example Four

Fifty gm of the "ERL-4211" cycloaliphatic epoxy resin was mixed with about fifty gm of hexahydro-4-methylphthalic anhydride and 0.4 gm N,N dimethyl benzylamine. The mixed solution was stirred for approximately ten minutes to assure uniform mixing. Five gm of copper and forty-five gm of silver powder was added to 7.5 gm of the mixed solution and formed into a printable paste. The average particle sizes for the copper and silver powders ranged from about four to about five microns in diameter. A layer of this paste material was printed onto a copper substrate. This layer was then cured at approximately 190° C. for about two hours. The resistance of the cured resistors (3 inch long and 0.003 square inch cross section area) measured about 400 milliohms (mΩ).

Example Five

Fifty gm of the "ERL-4211" cycloaliphatic epoxy resin was mixed with about fifty gm of hexahydro-4-methylphthalic anhydride and 0.4 gm N,N dimethyl benzylamine. The mixed solution was stirred for about ten minutes to assure uniform mixing. Twenty gm of copper and thirty gm of silver powder was added to 7.5 gm of the mixed solution and formed into a printable paste. The average particle sizes for the copper and silver powders ranged from about four to about five microns in diameter. A layer of this paste material was printed onto a copper substrate. This layer was then cured at approximately 190° C. for about two hours. The resistance of the cured resistors (3 inch long and 0.003 square inch cross section area) measured about 25 ohm (Ω).

Example Six

Fifty gm of the "ERL-4211" cycloaliphatic epoxy resin was mixed with about fifty gm of hexahydro-4-methylphthalic anhydride and 0.4 gm N,N dimethyl benzylamine. The mixed solution was stirred for about ten minutes to assure uniform mixing. Four gm of fluorinated graphite available from Alfa Aesear, Ward Hill, Mass. and 5.4 gm silver nano-powders available from Cima NanoTech, Inc., North Industrial Park, Caesarea, Israel, having a D90 particle size of 0.07 micron was added to 7.5 gm of the mixed solution and formed into a printable paste. A layer of this paste material was printed onto a copper substrate. This layer was then cured at approximately 200 degrees C. for about two hours. The resistance of the cured resistors (3 inch long and 0.003 square inch cross section area) measured about 90 ohm (Ω).

Example Seven

Fifty gm of the "ERL-4211" cycloaliphatic epoxy resin was mixed with about fifty gm of hexahydro-4-methylphthalic anhydride and 0.4 gm N,N dimethyl benzylamine. The mixed solution was stirred for about ten minutes to assure uniform mixing. Four gm of fluorinated graphite available from Alfa Aesear and four gm silver nano-powders available from Cima NanoTech, Inc., having a D90 particle size of 0.07 micron was added to 7.5 gm of the mixed solution and formed into a printable paste. A layer of this paste material was printed onto a copper substrate. This layer was then cured at approximately 200 degrees C. for about two hours. The resistance of the cured resistors (3 inch long (MΩ).

The following Table summarizes examples of some metals used in combination with the same amount of polymer material to form resistors of similar dimensions, and the resulting resistance values read across these resistors.

TABLE

Resistance Change with Silver/Copper Ratio

| Metal | Polymer | Resistor size | Resistance |
|---|---|---|---|
| 50 gm silver | 7.5 gm | 3 inch long and 0.003 square inch cross section area | 120 mΩ |
| 45 gm silver + 5 gm Cu | 7.5 gm | 3 inch long and 0.003 square inch cross section area | 400 mΩ |
| 30 gm silver + 20 gm Cu | 7.5 gm | 3 inch long and 0.003 square inch cross section area | 25 Ω |
| 12 gm silver + 38 gm Cu | 7.5 gm | 3 inch long and 0.003 square inch section area | 70 MΩ |
| 50 gm Cu | 7.5 gm | 3 inch long and 0.003 square inch section area | 120 MΩ |

Thus there has been shown and described a circuitized substrate having one or more internal resistors as part thereof, which substrate can be formed using many conventional PCB processes to thereby reduce costs associated with production thereof. The substrates produced herein are readily adaptable for use in electrical assemblies in which one or more electrical components such as semiconductor chips may be positioned thereon and coupled thereto. There have also been defined several examples of resistor materials which can be positioned between two adjacent conductors as part of such a circuit line to form circuitry for these substrates. Most significantly, the invention affords the opportunity to vary the resistances between conductors by varying the resistor material composition, as represented by the foregoing Examples. Such latitude greatly assists the circuit designer in meeting varying operational requirements.

While there have been shown and described what at present are considered the preferred embodiments of the invention, it will be obvious to those skilled in the art that various changes and modifications may be made therein without departing from the scope of the invention as defined by the appended claims. The invention as defined herein is capable of transmitting both regular and high speed (frequency) signals, the latter at a rate of from about one Gigabits/sec to about ten Gigabits/second, while substantially preventing impedance disruption. It is also capable of being produced using many conventional PCB processes so as to assure reduced cost and facilitate ease of manufacture. Of perhaps greater significance, the invention is able to assure circuit pattern miniaturization as is deemed extremely important with regards to many of today's design requirements.

What is claimed is:

1. A method of making a circuitized substrate comprising:
providing a first dielectric layer;
forming a first electrical conductor on said first dielectric layer;
forming an opening within said first electrical conductor;
positioning a quantity of resistor material within said opening within said first electrical conductor;
forming a second dielectric layer substantially over said quantity of resistor material within said opening within, said first electrical conductor;
forming a second electrical conductor on said second dielectric layer; and
passing an electrical connection through said second electrical conductor and said quantity of resistor material, said electrical connection being unconnected, electrically, to said first electrical conductor, to substantially reduce the capacitance between said first and second electrical conductors and increase the high frequency resistance in said electrical connection therebetween.

2. The method of claim 1 wherein said first and second electrical conductors are formed using photolithographic processing.

3. The method of claim 1 wherein said positioning of said quantity of resistor material within said opening within said first electrical conductor is accomplished using screen printing.

4. The method of claim 1 further wherein said quantity of resistor material is deposited in paste form, said method further including substantially curing said resistor material prior to said forming of said second dielectric layer substantially over said first electrical conductor and said quantity of resistor material within said opening within said first electrical conductor.

5. The method of claim 1 further including providing an interim dielectric layer over said first electrical conductor having said opening therein and forming a second opening within said interim dielectric layer aligned over said opening within said first electrical conductor.

6. The method of claim 5 wherein said interim dielectric layer is laminated onto said first electrical conductor and said quantity of resistor material is also positioned within said second opening within said interim dielectric layer.

7. The method of claim 1 wherein said forming of said electrical connection between said second electrical conductor and said first electrical conductor is accomplished by forming a thru-hole through said quantity of resistor material.

8. The method of claim 7 wherein said forming of said giro-hole comprises drilling a hole through said second dielectric layer and thereafter plating a conductive layer on the internal surfaces of said hole.

\* \* \* \* \*